(12) United States Patent
Efimov et al.

(10) Patent No.: US 7,925,964 B2
(45) Date of Patent: Apr. 12, 2011

(54) HIGH-THROUGHPUT MEMORY-EFFICIENT BI-SOVA DECODER ARCHITECTURE

(75) Inventors: Andrey Efimov, St. Petersburg (RU); Andrey V Belogolovy, St. Petersburg (RU); Vladislav A Chernyshev, St. Petersburg (RU)

(73) Assignee: Intel Corporation, Santa Clara, CA (US)

( * ) Notice: Subject to any disclaimer, the term of this patent is extended or adjusted under 35 U.S.C. 154(b) by 1112 days.

(21) Appl. No.: 11/644,283

(22) Filed: Dec. 22, 2006

(65) Prior Publication Data
US 2008/0152045 A1    Jun. 26, 2008

(51) Int. Cl.
*H03M 13/03* (2006.01)
(52) U.S. Cl. ........ 714/795; 714/792; 714/794; 714/796; 375/262; 375/265; 375/341

(58) Field of Classification Search ................ 714/792, 714/794–796; 375/262, 265, 341
See application file for complete search history.

(56) References Cited

U.S. PATENT DOCUMENTS

| | | | |
|---|---|---|---|
| 6,697,443 B1 * | 2/2004 | Kim et al. | 375/341 |
| 6,829,313 B1 * | 12/2004 | Xu | 375/341 |
| 7,200,799 B2 * | 4/2007 | Wang et al. | 714/795 |
| 7,236,546 B2 * | 6/2007 | Egnor et al. | 375/341 |
| 7,467,347 B2 * | 12/2008 | Orio | 714/792 |
| 7,607,072 B2 * | 10/2009 | Ashley et al. | 714/792 |

* cited by examiner

*Primary Examiner* — Esaw T Abraham
(74) *Attorney, Agent, or Firm* — Lee & Hayes PLLC

(57) ABSTRACT

Described herein are one or more implementations of a high-throughput and memory-efficient "windowed" bidirectional Soft Output Viterbi Algorithm (BI-SOVA) decoder. The described BI-SOVA decoder uses the "window" technique to concurrently decode several different non-overlapping portions of a subject signal in parallel.

22 Claims, 6 Drawing Sheets

*Background*

*Background*

Background

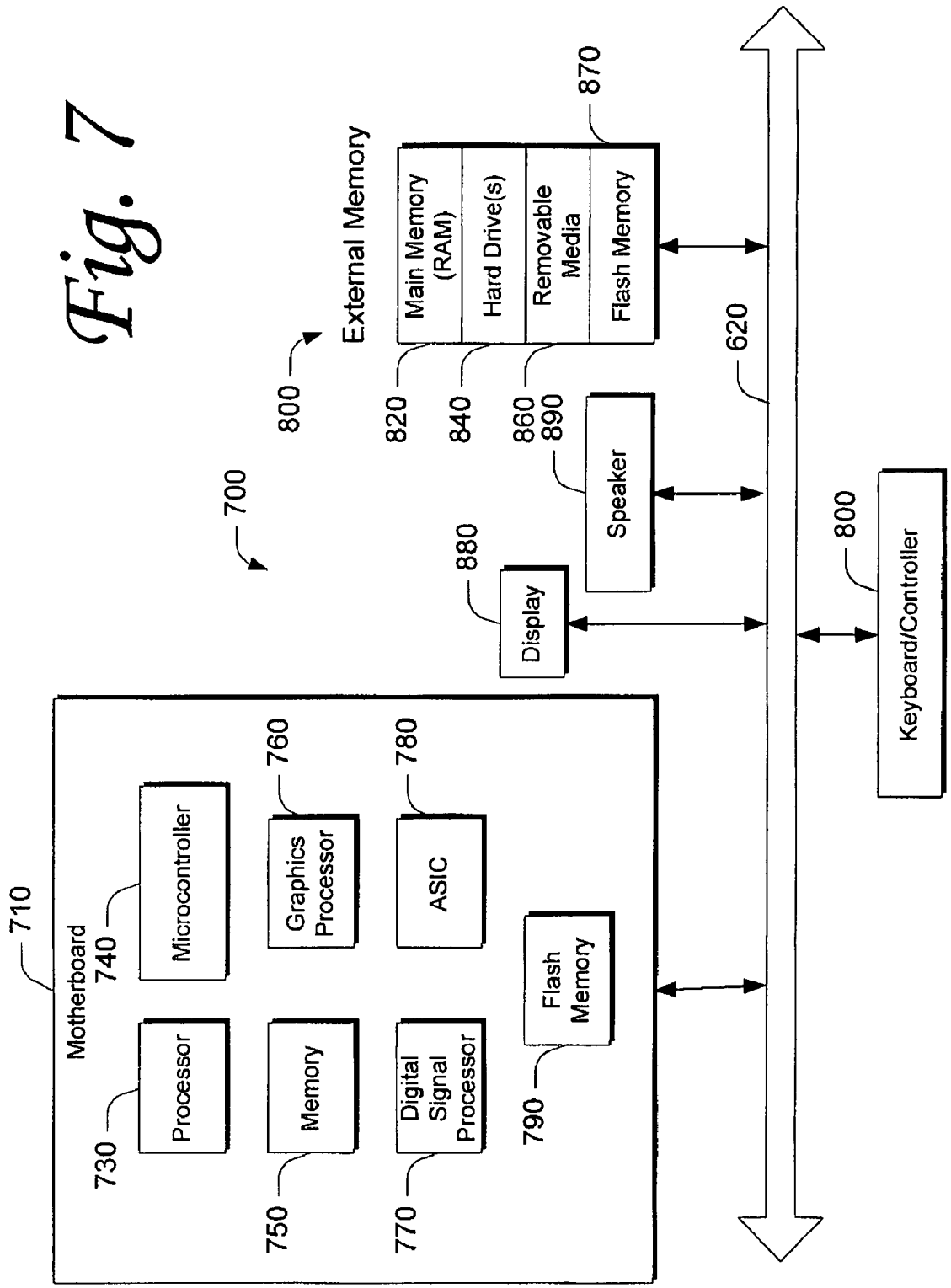

HIGH-THROUGHPUT MEMORY-EFFICIENT BI-SOVA DECODER ARCHITECTURE

BACKGROUND

Forward Error Correction (FEC) codes have become a concurrent part of all modern communication systems. FEC involves processing a digital signal in order to improve data reliability by "introducing a known structure into a data sequence prior to transmission or storage. This structure enables a receiving system to detect and possibly correct errors caused by corruption from the channel and the receiver. As the name implies, this coding technique enables the decoder to correct errors without requesting retransmission of the original information." (Crosslink is the Aerospace Corporation's magazine of advances in aerospace technology. The Aerospace Corporation (Volume 3, Number 1 (Winter 2001/2002))).

Convolutional turbo codes (CTC) and low-density parity-check codes (LDPC) are commonly used FEC code types. Both CTC and LDPC use iterative decoding algorithms that are based on a combination of soft-input-soft-output (SISO) decoders separated by interleavers. SISO decoder uses "soft information"—which is data with "soft" reliability—as input and produces soft information, but the output has more reliability than the input.

SISO decoders commonly employ two approaches: maximum a posteriori (MAP) decoding algorithm or Soft Output Viterbi Algorithm (SOVA). Of the two, MAP is generally considered to give the best performance in terms of minimizing decoding errors. However, SOVA is considered to be significantly less complex.

SOVA is a variant of the classical Viterbi algorithm, which is a dynamic approach for finding the most likely sequence of hidden states that result in a sequence of observed events. According to wikipedia.com:

"SOVA differs from the classical Viterbi algorithm in that it uses a modified path metric which takes into account the a priori probabilities of the input symbols, and produces a soft output indicating the reliability of the decision.

The first step in the SOVA algorithm is the selection of the survivor path, passing through one unique node at each time instant, t. Since each node has 2 branches converging at it (with one branch being chosen to form the Survivor Path, and the other being discarded), the difference in the branch metrics (or cost) between the chosen and discarded branches indicate the amount of error in the choice.

This cost is accumulated over the entire sliding window (usually equals at least five constraint lengths), to indicate the soft output measure of reliability of the hard bit decision of the Viterbi algorithm."

BRIEF DESCRIPTION OF THE DRAWINGS

The same numbers are used throughout the drawings to reference similar elements and features.

FIG. 7 illustrates an exemplary system suitable to carry out (wholly or in part) one or more implementations described herein.

DETAILED DESCRIPTION

The overall system throughput is the key characteristic of all communication systems. A Forward Error Correction (FEC) code decoder (herein, a "FEC decoder") strongly influences the overall throughput of the system. Generally, the overall system throughput improves with improved throughput of the FEC decoder.

One or more implementations are described herein regarding a new architecture that improves, for example, the throughput of a FEC decoder. More particularly, the improved FEC decoder uses a bidirectional Soft Output Viterbi Algorithm (BI-SOVA) decoder in a manner that has not been done before.

Classical SOVA Decoders

SOVA decoders are commonly used as a part of turbo code decoders in different data transmission systems. For example, SOVA decoders are used in systems using the standards Institute of Electrical & Electronics Engineers (IEEE) 802.16e and 3rd Generation Partnership Project (3GPP) Long Term Evaluation (LTE). Generally, SOVA decoders have a lesser computational complexity than MAP decoders. So, SOVA decoders can be used in smaller chips.

The general scheme of a conventional BI-SOVA decoder is discussed by R. H. Morelos-Zaragoza in "The art of error correcting coding." Chichester: John Wiley & Sons, 2002. In short, BI-SOVA combines the soft-outputs provided by both forward and backward SOVA decodings.

Figure 1:
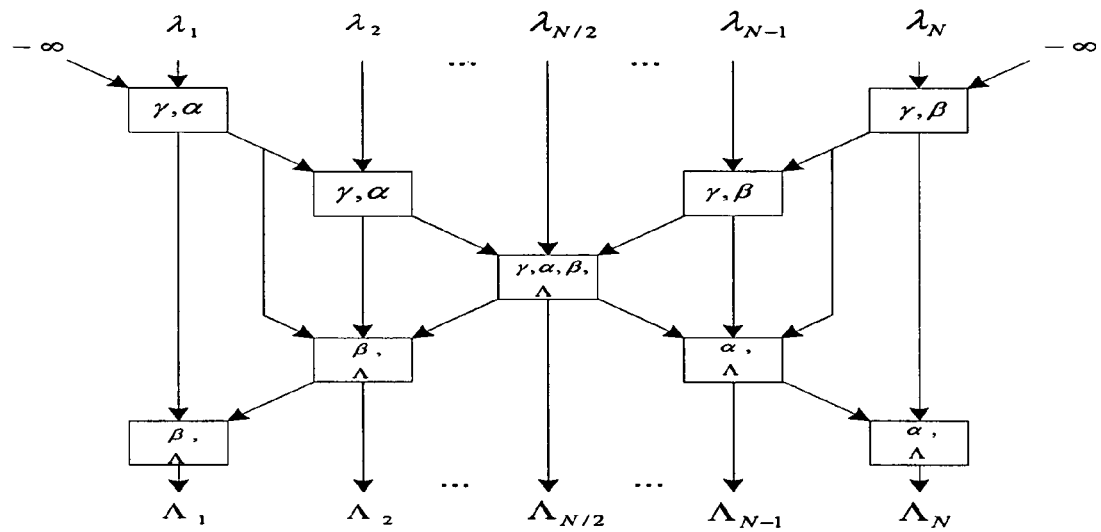
FIG. 1 illustrates a data flow of a conventional BI-SOVA decoder.

FIG. 1 depicts the data flow or data-calculation flow of a conventional or classical BI-SOVA decoder. As shown in FIG. 1, a γ-block is a branch metric calculation block, an α-block is a forward metric calculation block, a β-block is a backward metric calculation block, and a Λ-block is an output reliability calculation block. Two or more types of blocks shown in one rectangle in this drawing indicate that these two or more types of blocks perform their calculations concurrently.

The objective of a typical SISO decoding algorithm is to compute output log-likelihoods (Λ) based on input log-likelihoods (received from a demodulator, for example) and the trellis structure of the code. BI-SOVA decoder processing consists of three main steps:

Step 1: Branch metrics (γ-) computation based on input (λ-) reliabilities;

Step 2: State metrics computation through Forward (α-) and Backward (β-) recursions based on branch metrics;

Step 3: Output log-likelihoods (Λ-) computation based on branch and state metrics.

The main disadvantage of the classical BI-SOVA decoder—as depicted in FIG. 1—is the high delay at Step 2 (i.e., in the state metrics computation procedure). The delay is because of the computation costs of a series of recursions being performed in a consecutive manner. The calculations of state metrics for the next level of the trellis begin only after all the metrics from the previous level have been computed. In addition to this delay, classical BI-SOVA decoders consume memory resources. Since output log-likelihoods can be computed only after both forward and backward metrics for the trellis edge are known, conventional BI-SOVA decoders consume massive resources to store the entire state metric history from the beginning to the end of the trellis.

Figure 2:
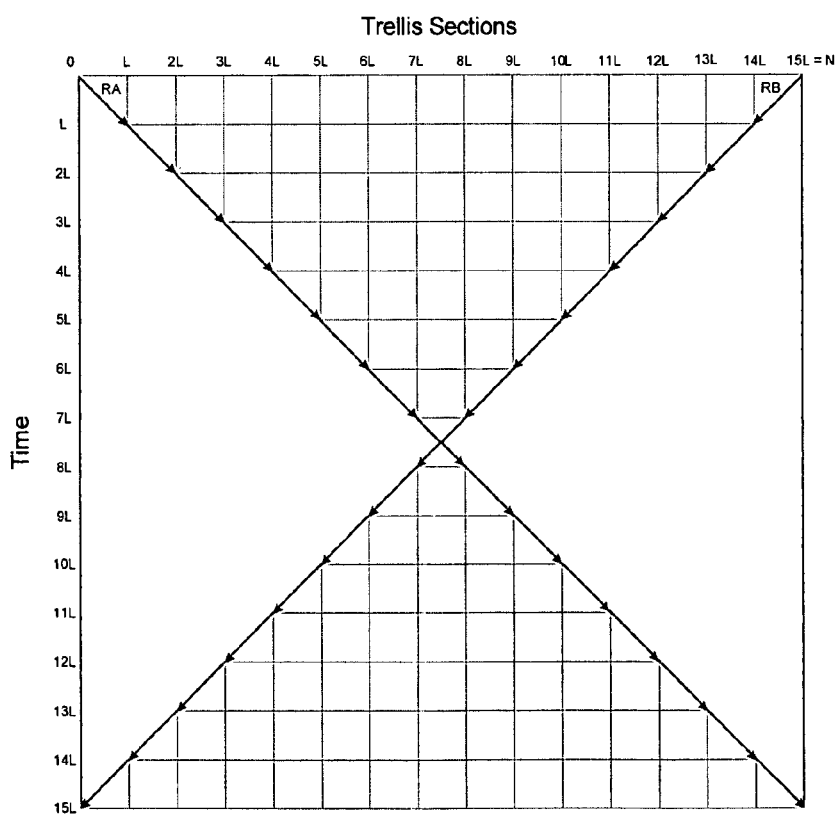
FIG. 2 is a timing/memory diagram for a conventional BI-SOVA decoder.

FIG. 2 is a timing/memory diagram for the classic BI-SOVA decoders. As depicted, a trellis has length N and is divided into sections of length L. For ease of understanding and comparison, the trellis—depicted in FIG. 2 and in the following figures—is divided into an equal number of sections (15 sections). In FIG. 2, RA is representative of a forward recursion computation block, and RB is representative of a backward recursion computation block.

The diagram of FIG. 2 shows forward and backward recursion flows with time. Also, the diagram shows the required branch and state metrics delays (as shaded areas) before output log-likelihoods can be computed. Recall, to compute output log-likelihoods, three numbers should be computed: branch metrics, and forward and backward metrics. Decoding latency is proportional to the height of the graph, and storage requirements are proportional to the number of buffers in the graph (i.e., to the area filled with gray color).

The well-known modification of the SOVA decoder (the so-called windowed SOVA decoder) was described by J. Hagenauer and P. Hoeher in "A Viterbi Algorithm with Soft-Decision Outputs and Its Applications," IEEE Globecom, pp. 1680-1686, 1989. In the context of a SOVA decoder herein, a "windowed" decoder does not process the whole trellis; rather, it processes only the part of trellis. The length of the part being processed is called a "window" or the processing area. Alternatively, the processing of the processing area is called "slide window processing" because after processing of the first processing area, the processing area move one state forward; thus, the processing "slides" over the whole trellis state-by-state.

The windowed SOVA decoder is usually used in hardware to reduce the memory requirement. The basis for this approach is the fact that the backward recursion can start from all zero vectors at any time. Initially, the state metrics generated are not accurate enough, but after a few trellis sections (i.e., a few constraint lengths of convolutional code (CC) the set of state metrics are as reliable as if the process had been started at the final node. So, these metrics can be used to obtain output reliabilities.

Figure 3:
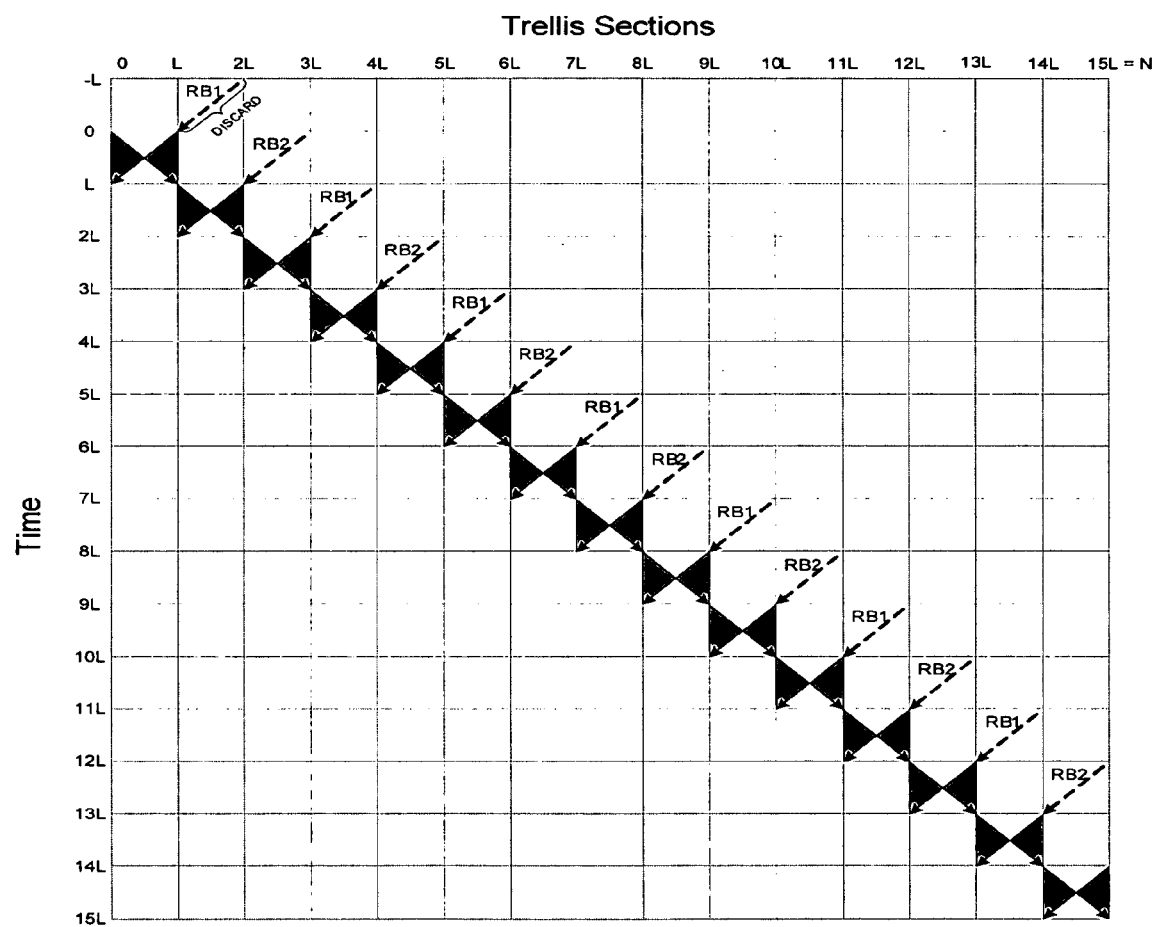
FIG. 3 is a timing/memory diagram for a conventional "windowed" BI-SOVA decoder.

FIG. 3 shows a timing/memory diagram for a classical "windowed" BI-SOVA decoder for an architecture with one forward processor (RA) and two backward processors (RB1 and RB2), which has almost the same decoder throughput as the classical SOVA architecture of FIG. 2. In FIG. 3, the "window" width is equal to 2L trellis branches, then the first L branches (represented as dotted arrows) in the "window" are used to calculate accurate approximations of the state metrics, and the last L branches (represented as solid arrows) are used to compute output reliabilities.

New BI-SOVA Decoder

Described herein are one or more implementations of a high-throughput and memory-efficient architecture based, in part, on the "windowed" BI-SOVA decoder. The new architecture relies on two assumed facts:

The forward and backward recursions are identical, and
The recursion can start from all zero vectors at any time.

Unlike the classical "windowed" BI-SOVA decoder, this new architecture computes both the backward recursion and the forward recursion using a "window" technique. Furthermore, this new architecture uses the "window" technique to start forward and backward metrics computations from several trellis sections in parallel. Doing this increases the new decoder's throughput in times. The new BI-SOVA architecture is flexible. More starting points increase the overall throughput. So, it is possible to select as many starting points as is necessary to provide the throughput desired.

In one or more implementations, the number of the starting points is defined by taking into account the following:

1. The data throughput required. By knowing the section processing time (which would be known after hardware design of the section processing unit) and the length of the trellis (or the number of sections in the trellis), one can find the minimum number of starting points that is required to provide the desired throughput.

2. The overheads of multiple starting points. For every new starting point, one may calculate the input data for backward recursion that can be obtained by processing one more additional section on the left of the current section (depicted as "RA2", "RA3" . . . in the FIG. 4). These computations would be redundant in case of single starting point decoding, because this data will be prepared by previously processed sections. Thus, it is often desirable to make a special processing schedule with the minimum number of interruptions in processing chain.

Figure 4:
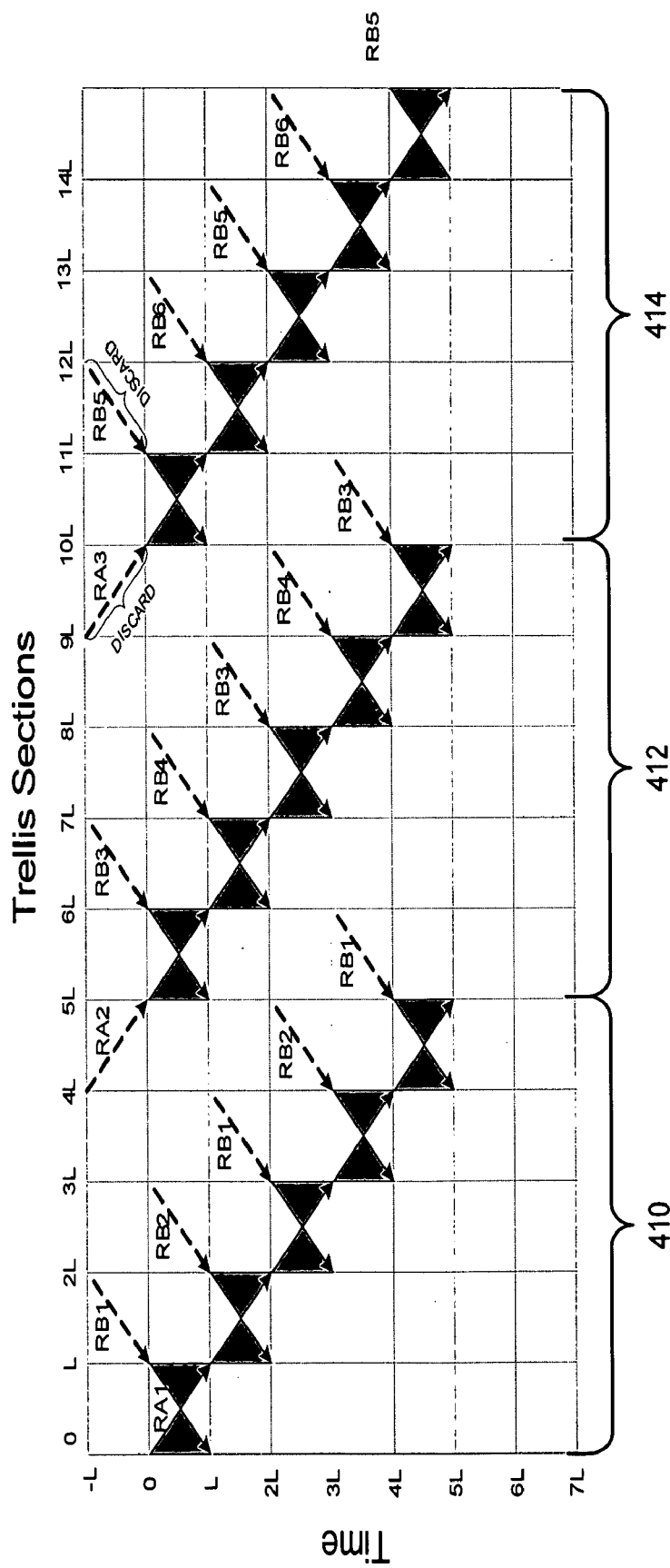
FIG. 4 a timing/memory diagram for a new BI-SOVA decoder in accordance with one or more implementations described herein.

3. Defining a schedule. For example, in FIG. 3 the reader sees that in one time period only one process accesses one trellis section, and every time slots only two different sections are accessed. Most of the time sections are not used. This appears to be inefficient. To minimize unused time, another access schedule can be used like as is shown in FIG. 4. Here one can see that again, in one time period only one process accesses one trellis section, but, unlike the conventional approach, during every time slot multiple (e.g., six) different sections are accessed. A highly desirable schedule is the one that will have no "white spaces" (i.e., unused spaces) in the table. However, such a schedule may be impractical (or impossible) to build. So, short that that, it is desirable to minimize the "white spaces" From the opposite side, decreasing of the "white" spaces will lead to increasing of the redundant processing paths (like "RA2", "RA3" in FIG. 4). Consequently, an ideal schedule is typically a trade-off between minimum of "white spaces" and minimum of redundant paths.

FIG. 4 shows a timing/memory diagram for one or more implementations of the described new BI-SOVA decoder. In the diagram, RA1, . . . , RA3 represents the forward recursion computation blocks that work in parallel with RB1, . . . , RB6, represent the backward recursion computation blocks. Typically, there will be twice as many backward recursion computation blocks as forward ones.

The exemplary scheme shown in FIG. 4 has three starting points. Those starting points are at trellis sections: 0, 4L, and 9L. Each of those starting points defines a parallel concurrent-decoding track, for example, tracks 410, 412, and 414. These tracks represent concurrent BI-SOVA decoding of the multiple different, non-overlapping, adjacent, equal-sized portions of a subject signal.

One can see that this exemplary scheme throughput is almost three times higher than that of classic architectures. It requires 6L clocks instead of 16L clocks for the classical "windowed" approach. In general, the throughput of one or more implementations of the described new BI-SOVA decoder is many times better than the classical approach. Indeed, the throughput improvement is roughly K-times the throughput of the classical approach, where K is the number of starting points.

One or More Exemplary Embodiments

Figure 5:
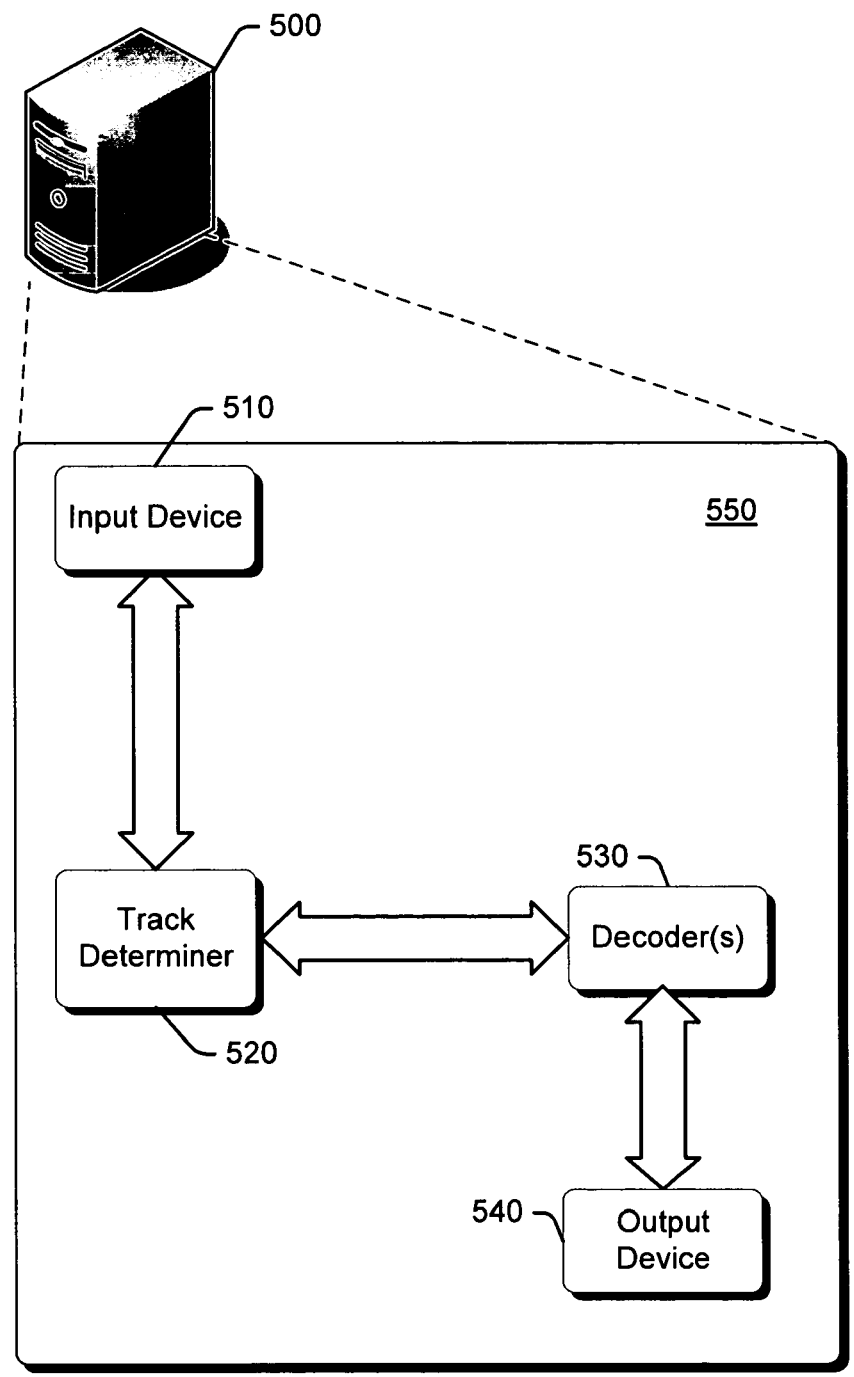
FIG. 5 is a functional block illustration of a BI-SOVA decoder architecture in accordance with one or more implementations described here.

FIG. 5 illustrates a simplistic functional block diagram of a decoder system that is suitable for one or more implementations of the described new BI-SOVA decoding approach. This figure depicts the computing device 500 with multiple functional components, such as input device 510, parallel-decoding track determiner 520, one or more BI-SOVA decoders 530, and output device 540. These components may be implemented as hardware, firmware, software, or some combination thereof.

Although not depicted, other components may include at least one processing core (which includes essential processing components and related memory systems) and a memory system (which may be represented by block 550).

The input device 510 is configured to obtain signals (e.g., data) especially signals that are potentially received over noisy communication channels. The output device 540 may include any device for transmitting or recording the processed signals.

The parallel-decoding track determiner 520 determines the location of each different, non-overlapping, equal-sized portions of a subject signal. In effect, the parallel-decoding track determiner 520 determines the starting point location of each concurrently decoded track in the subject signal.

The BI-SOVA decoders 530 includes functional sub-components for doing multiple concurrent decodings of portions of a subject signal. The functional sub-components for parallel portion decoding will employ at least one forward recursion computation block and two backwards recursion computation blocks.

In one or more implementations, every decoder will have memory cells (e.g., storage and buffers) to store the data. Each node of the trellis may store two values: "alpha" and "beta", also output reliabilities "lambda (capitalized)" may be stored. From the logics side the units are: alpha, beta, gamma and lambda calculators and memory cells where calculators store and buffer their input and output values. The BI-SOVA decoder performs all or part of the new approach described herein for the new high-throughput and memory-efficient architecture.

The output devices 540 produce the results of the BI-SOVA decoders 530. These results are typically transmitted or stored. The results produced by the BI-SOVA decoders 530 include error-corrections in message transmitted, for example, the codeword is +1, −1, +1, +1, +1, −1, −1, +1 . . . , after noisy channel with soft output (for example, Gaussian channel) it becomes +0.7, −1.3, −0.3, +1.2, +0.3, −1.3, −0.5, +0.4 . . . . The signs of the third items in each list (which are −1 and −0.03 respectively) are different. Consequently, these items are in error in received vector. After processing the decoder will return the vector like +1, −1, +1, +1, +1, −1, −1, +1 . . . . In case of successful decoding, all signs are equivalent to their transmitted values. For binary codes it is often only sign that carries the information. That is called as BPSK mapping, which is the same as binary phase shift keying.

To do the decoding the decoder used the redundant information in the codeword. The decoder may not always return the correct vector. The decoder may fail because of different reasons. For example, the noise in the channel was very high, and it was impossible to reconstruct the message. To analyze the results the bit error rate (BER) is often considered. Bit error rate is the probability of error bit at the output of the decoder. Typically, the lower is BER the better is decoding.

Methodological Implementation

Figure 6:
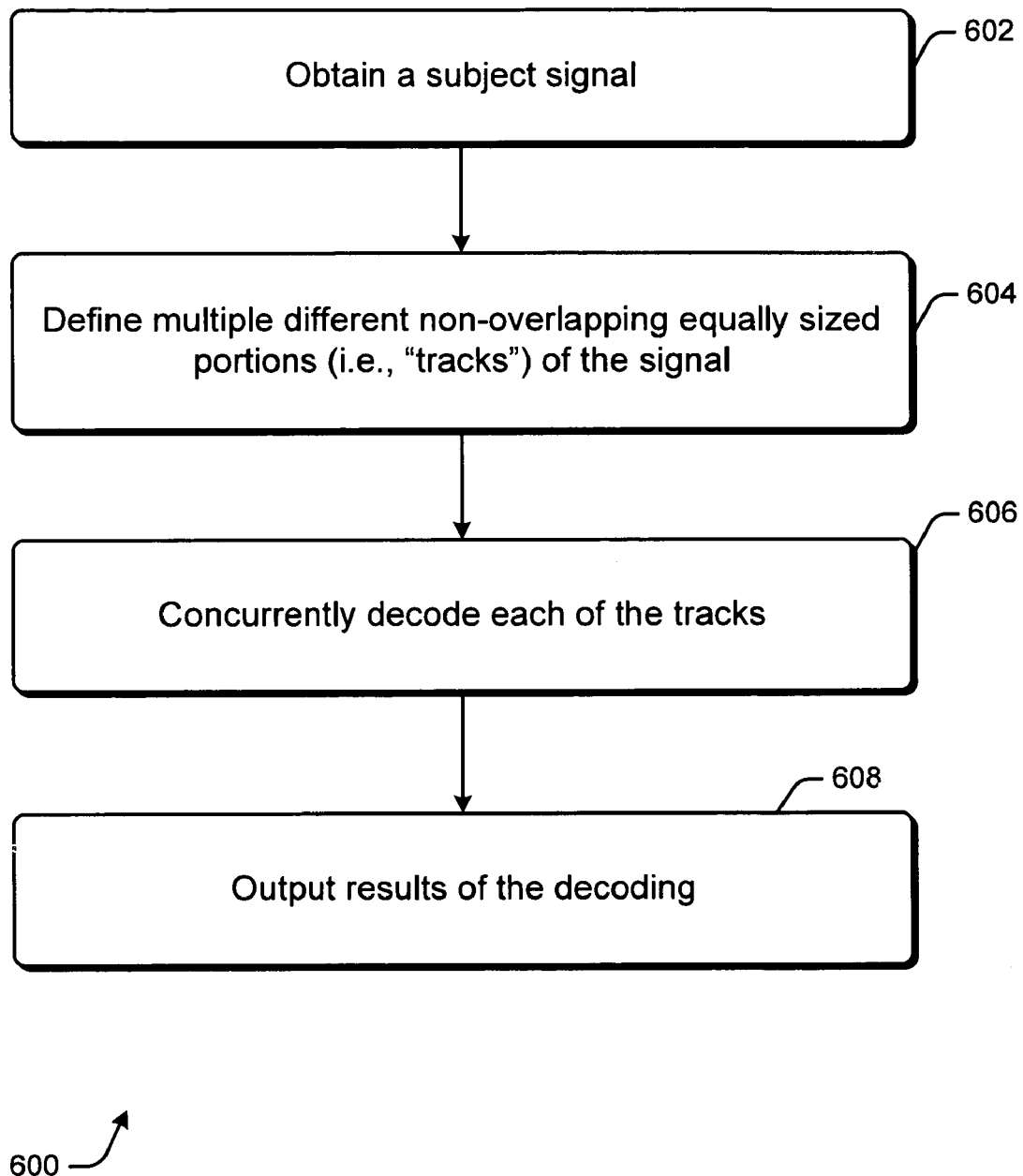
FIG. 6 illustrates a flow diagram showing a methodological implementation described herein.

FIG. 6 shows method 600 for a BI-SOVA decoding approach. This method 600 is performed by one or more of the various components depicted in FIG. 5. Furthermore, this method 600 may be performed in software, hardware, firmware, or a combination thereof. For ease of understanding, this method is delineated as separate steps represented as independent blocks in FIG. 6; however, these separately delineated steps should not be construed as necessarily order dependent in their performance. In addition, for discussion purposes, method 600 is described with reference to FIG. 5. Also for discussion purposes, particular components are indicated as performing particular functions; however, other components (or combinations of components) may perform the particular functions.

At 602 of FIG. 6, the input device 510 obtains the subject data signal. This signal may be obtained via a wireless receiver (e.g., an antenna), a wired receiver, or via a storage medium. This subject data signal will be the subject of the processing for many purposes, such as error correction or equalization.

At 604, the track-determiner 520 defines the location of each parallel concurrent-decoding track in the subject data signal. More particularly, the track-determiner 520 determines the starting point location of each concurrently decoded track in the subject signal. For example, in the exemplary scheme shown in FIG. 4, the track-determiner 520 determines the starting points of the concurrent-decoding tracks 410, 412, and 414. Those locations are at trellis sections: 0, 4L and 9L, respectively. Stated another way, the track-determiner 520 may be described as evenly dividing the signal into multiple non-overlapping portions. Typically, these portions are of equal or near equal length; however, one or more implementations may employ non-equally divided portions if it is deemed desirable to do so.

The determination by the track-determiner 520 may be calculated based a fixed number of tracks per signal. Alternatively, the determination may be a calculation based upon the properties of or characteristics of the subject signal.

At 606, the decoder (or decoders) 530 perform parallel "windowed" BI-SOVA decoding of each of the parallel concurrent-decoding tracks (specified by the track-determiner 520). The decoding of each track is performed concurrently. The decoding includes backward recursion and forward recursion using a "window" technique of BI-SOVA decoding.

At 608, the output device 540 produces the results of the decoder 530. These results are typically transmitted or stored.

Exemplary System

Referring to FIG. 7, a block diagram of an exemplary electronic system that can include transistors fabricated with copper interconnects, such as those described above is shown generally at 700. Such electronic system can comprise a computer system that includes a motherboard 710 which is electrically coupled to various components in electronic system 700 via a system bus 720. System bus 720 may be a single bus or any combination of busses.

Motherboard 710 can include, among other components, one or more processors 730, a microcontroller 740, memory 750, a graphics processor 760 or a digital signal processor 770, and/or a custom circuit or an application-specific integrated circuit 780, such as a communications circuit for use in wireless devices such as cellular telephones, pagers, portable computers, two-way radios, and similar electronic systems and a flash memory device 790.

The electronic system 700 may also include an external memory 800 that in turn includes one or more memory elements suitable to the particular application, such as a main memory 820 in the form of random access memory (RAM), one or more hard drives 840, and/or one or more drives that handle removable media 860, such as floppy diskettes, compact disks (CDs) and digital video disks (DVDs). In addition, such external memory may also include a flash memory device 870.

The electronic system 700 may also include a display device 880, a speaker 890, and a controller 800, such as a keyboard, mouse, trackball, game controller, microphone, voice-recognition device, or any other device that inputs information into the electronic system 700.

CONCLUSION

The techniques, described herein, may be implemented in many ways, including (but not limited to) program modules, general- and special-purpose computing systems, network servers and equipment, dedicated electronics and hardware, and as part of one or more computer networks. Furthermore, the described techniques are suitable for use in WiMax- and 3GPP-based devices and other communication-oriented applications that use turbo codes for error correction or turbo equalization techniques for equalization.

In addition, the techniques, described herein, may applicable to almost any computing or communication device. The techniques are particularly applicable to wireless, handheld, and portable communication devices. By way of example, wireless, handheld, and portable communication devices may include wireless and cellular telephones, smart phones, personal digital assistants (PDAs), web-tablets, and any device that may provide wireless access to a network, such as an intranet or the internet.

Although one or more above-described implementations have been described in language specific to structural features and/or methodological steps, it is to be understood that other implementations may be practiced without the specific features or steps described. Rather, the specific features and steps are disclosed as the preferred forms of one or more implementations.

The invention claimed is:

1. An apparatus comprising:
   a track-determiner configured to define location of multiple parallel-decoding tracks in a subject data signal, wherein the parallel-decoding tracks comprise multiple different portions of the subject data signal;
   one or more windowed bidirectional Soft Output Viterbi Algorithm (BI-SOVA) decoders configured to perform multiple concurrent decodings of the defined parallel-decoding tracks, wherein each of the decodings decodes at least one of the defined multiple parallel-decoding tracks; and
   an output device to output results of the multiple concurrent decodings.

2. An apparatus as recited in claim 1, wherein the track-determiner is further configured to determine a starting point location of multiple parallel-decoding tracks to be defined in the subject data signal.

3. An apparatus as recited in claim 1, wherein the track determiner determines a starting point in the subject data signal for each of the multiple parallel-decoding tracks in the subject data signal.

4. An apparatus as recited in claim 1, wherein the multiple different portions of the subject data signal are non-overlapping with other portions.

5. An apparatus as recited in claim 1, wherein the multiple different portions of the subject data signal are equally sized.

6. An apparatus as recited in claim 1, wherein the multiple different portions of the subject data signal are equally sized.

7. A method comprising:
   under control of one or more processors configured with executable instructions,
   defining location of multiple parallel-decoding tracks in a subject data signal, wherein the parallel-decoding tracks comprise multiple different portions of the subject data signal;
   performing multiple concurrent decodings of the defined parallel-decoding tracks, wherein each of the decodings is based upon bidirectional Soft Output Viterbi Algorithm (BI-SOVA) and decodes at least one of the defined multiple parallel-decoding tracks; and
   outputting results of the multiple concurrent decodings.

8. A method as recited in claim 7, wherein the decodings are based upon windowed BI-SOVA.

9. A method as recited in claim 7 further comprising determining a starting point location of multiple parallel-decoding tracks to be defined in the subject data signal.

10. A method as recited in claim 7, wherein the defining location of multiple parallel-decoding tracks in a subject data signal comprises determining a starting point in the subject data signal for each of the multiple parallel-decoding tracks in the subject data signal.

11. A method as recited in claim 7, wherein the multiple different portions of the subject data signal are non-overlapping with other portions.

12. A method as recited in claim 7, wherein the multiple different portions of the subject data signal are equally sized.

13. A method as recited in claim 7, wherein the multiple different portions of the subject data signal are approximately equally sized.

14. A computer-readable media having stored or embodied thereon computer-executable instructions that, when executed performs a method comprising:
   defining location of multiple parallel-decoding tracks in a subject data signal, wherein the parallel-decoding tracks comprise multiple different portions of the subject data signal;
   performing multiple concurrent decodings of the defined parallel-decoding tracks, wherein each of the decodings is based upon "windowed" bidirectional Soft Output Viterbi Algorithm (BI-SOVA) and decodes at least one of the defined multiple parallel-decoding tracks; and
   outputting results of the multiple concurrent decoding acts.

15. One or more media as recited in claim 14 further comprising determining a starting point location of multiple parallel-decoding tracks to be defined in the subject data signal.

16. One or more media as recited in claim 14, wherein the defining location of multiple parallel-decoding tracks in a subject data signal comprises determining a starting point in the subject data signal for each of the multiple parallel-decoding tracks in the subject data signal.

17. One or more media as recited in claim 14, wherein the multiple different portions of the subject data signal are non-overlapping with other portions.

18. One or more media as recited in claim 14, wherein the multiple different portions of the subject data signal are equally sized.

19. One or more media as recited in claim 14, wherein the multiple different portions of the subject data signal are approximately equally sized.

20. A system comprising:
   a controller to provide a subject data signal; and
   a device comprising:
   a track-determiner configured to define location of multiple parallel-decoding tracks in the subject data signal, wherein the parallel-decoding tracks comprise multiple different portions of the subject data signal;
   one or more windowed bidirectional Soft Output Viterbi Algorithm (BI-SOVA) decoders configured to perform multiple concurrent decodings of the defined parallel-decoding tracks, wherein each of the decodings decodes at least one of the defined multiple parallel-decoding tracks; and an output device to output results of the multiple concurrent decodings.

21. A system as recited in claim 20, wherein the track-determiner is further configured to determine a starting point of multiple parallel-decoding tracks to be defined in the subject data signal.

22. A system as recited in claim 20, wherein the track determiner determines a starting point in the subject data signal for each of the multiple parallel-decoding tracks in the subject data signal.

\* \* \* \* \*